(12) United States Patent
Tu et al.

(10) Patent No.: US 12,543,262 B2
(45) Date of Patent: Feb. 3, 2026

(54) THIN FILM CIRCUIT BOARD

(71) Applicant: CHIPBOND TECHNOLOGY CORPORATION, Hsinchu (TW)

(72) Inventors: Kung-Tzu Tu, Kaohsiung (TW);
Gwo-Shyan Sheu, Kaohsiung (TW);
Kuo-Liang Huang, Kaohsiung (TW);
Pei-Wen Wang, Taichung (TW);
Yu-Chen Ma, Kaohsiung (TW);
Chia-Hsin Yen, Kaohsiung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 160 days.

(21) Appl. No.: 18/544,631

(22) Filed: Dec. 19, 2023

(65) Prior Publication Data
US 2024/0389224 A1    Nov. 21, 2024

(30) Foreign Application Priority Data
May 18, 2023    (TW) .................................. 112118416

(51) Int. Cl.
*H05K 1/02* (2006.01)

(52) U.S. Cl.
CPC .......... *H05K 1/0271* (2013.01); *H05K 1/0209* (2013.01)

(58) Field of Classification Search
CPC ..... H05K 1/0201–0212; H05K 1/0271; H05K 3/041; H05K 3/305; H05K 7/20; H05K 7/2039; H05K 7/205–20509; H05K 2201/06–068; H05K 2201/10674; H01L 21/4882; H01L 21/707; H01L 23/34–3731; H01L 23/3736; H01L 2224/32225; H01L 2023/4037; H01L 2023/4068; H01H 9/52; F28F 3/00; F28F 3/06
See application file for complete search history.

(56) References Cited

U.S. PATENT DOCUMENTS

2012/0092833 A1* 4/2012 Chang .................. H05K 1/0204
                                                            361/710
2019/0250446 A1  8/2019 Cheng et al.
(Continued)

FOREIGN PATENT DOCUMENTS

CN      111757637 A     10/2020
JP      2002-124607 A    4/2002
(Continued)

OTHER PUBLICATIONS

Korean office action mailed Apr. 4, 2025 for Korean patent application No. 10-2023-0185747, 8 pages.
(Continued)

*Primary Examiner* — Amir A Jalali
(74) *Attorney, Agent, or Firm* — Demian K. Jackson; Jackson IPG PLLC

(57) ABSTRACT

A thin film circuit board includes a substrate and a thermal conductive film which is adhered to the substrate and includes a first conductive portion, a second conductive portion and a third conductive portion. The thermal conductive film is designed to be polygonal and non-rectangular in order to reduce stress generated in the substrate and the thermal conductive film and protect the thin film circuit board from warpage.

16 Claims, 7 Drawing Sheets

(56) References Cited

U.S. PATENT DOCUMENTS

| | | | |
|---|---|---|---|
| 2019/0252298 A1* | 8/2019 | Hsieh | H01L 23/562 |
| 2021/0227679 A1* | 7/2021 | Lin | H05K 13/043 |
| 2021/0337667 A1 | 10/2021 | Iwai et al. | |
| 2023/0380072 A1* | 11/2023 | Chen | H01L 24/79 |
| 2024/0014092 A1* | 1/2024 | Chung | H01L 23/4985 |
| 2024/0079290 A1* | 3/2024 | Murozaki | H01L 23/49562 |

FOREIGN PATENT DOCUMENTS

| | | |
|---|---|---|
| JP | 2003-092011 A | 3/2003 |
| JP | 2005-310957 A | 11/2005 |
| JP | 2023-024926 A | 2/2023 |
| KR | 10-0785950 B1 | 12/2007 |
| KR | 10-2024-0008770 A | 1/2024 |
| WO | 2008/078587 A1 | 7/2008 |

OTHER PUBLICATIONS

Japanese office action mailed Feb. 19, 2025 for Japanese patent application No. 2023-213743, 4 pages.
Taiwanese Office Action mailed Oct. 16, 2023 for Taiwanese Patent Application No. 112118416, 9 pages.
Korean notice of allowance mailed Dec. 22, 2025 for Korean patent application No. 10-2023-0185747, 3 pages.

* cited by examiner

US 12,543,262 B2

THIN FILM CIRCUIT BOARD

FIELD OF THE INVENTION

This invention relates to a thin film circuit board, and more particularly to a thin film circuit board which includes a polygonal and non-rectangular thermal conductive film.

BACKGROUND OF THE INVENTION

Conventionally, a circuit board tape is manufactured in roll-to-roll transport system, especially thermal conductive film attachment process and flip-chip bonding process, and it is cut into multiple chip-on-film (COF) packages. Each of the COF packages is hold on a fixture in order to bond to an electronic component, e.g. display panel or circuit board.

As shown in FIGS. 1 and 2, a conventional thin film circuit board 10 includes a substrate 11 and a thermal conductive film 12 which is adhered to a surface 11a of the substrate 11 by an adhesive 13. The thermal conductive film 12 is provided to lower the operating temperature of a chip 20 mounted on another surface 11b of the substrate 11. The substrate 11, the thermal conductive film 12 and the adhesive 13 have different material properties, such as different plasticity, ductility or thermal extension coefficient, so warpage or bending may be detected in the thin film circuit board 10 while the thin film circuit board 10 is hold on a fixture, or the substrate 11, the thermal conductive film 12 and the adhesive 13 are influenced by processing temperature. For this reason, the conventional thin film circuit board 10 may be deformed and unable to be bonded to an electronic component correctly.

SUMMARY

One object of the present invention is to provide a thin film circuit board in which a polygonal and non-rectangular thermal conductive film is adhered to a substrate to prevent the thin film circuit board from warpage or bending.

A thin film circuit board of the present invention includes a substrate and a thermal conductive film. The substrate has a first surface and a second surface which is provided for placement of a first chip and a second chip. The thermal conductive film is polygonal and non-rectangular and is adhered to the first surface of the substrate. The thermal conductive film includes a first conductive portion, a second conductive portion and a third conductive portion which is located between and connected to the first and second conductive portions. The first and second chips on the second surface of the substrate are located over the thermal conductive film, such that a first chip shadow and a second chip shadow are projected onto the thermal conductive film.

The shape of the thermal conductive film is polygonal and non-rectangular, and the third conductive portion is designed to be connected to the first and second conductive portions so as to improve bend resistance of the substrate and to lower stress generated in the thermal conductive film and the substrate. Thus, warpage or bend of the thin film circuit board can be prevented, at the same time, area of the thermal conductive film can be increased to improve thermal performance.

DETAILED DESCRIPTION OF THE INVENTION

Figure 1:
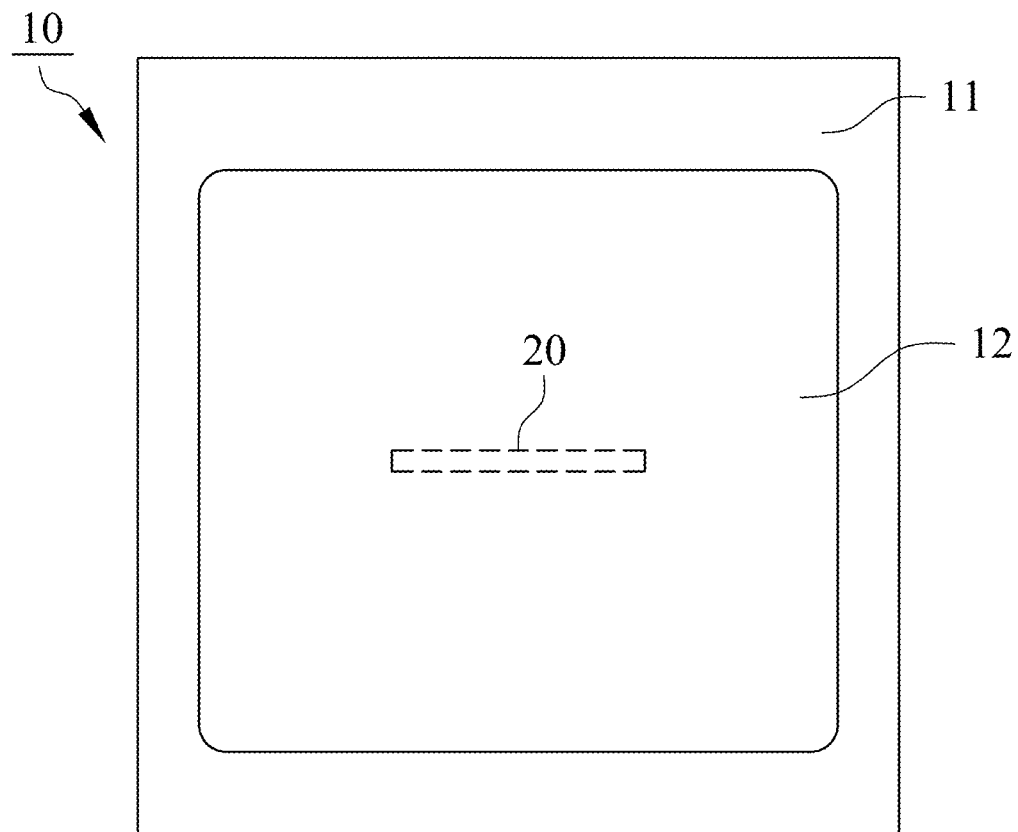
FIG. 1 is a bottom view diagram illustrating a conventional thin film circuit board.
Figure 2:
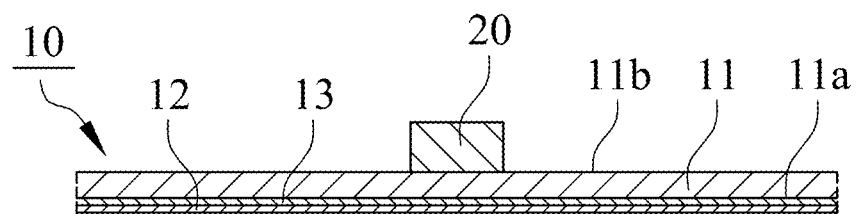
FIG. 2 is a cross-section view diagram illustrating a conventional thin film circuit board.
Figure 3:
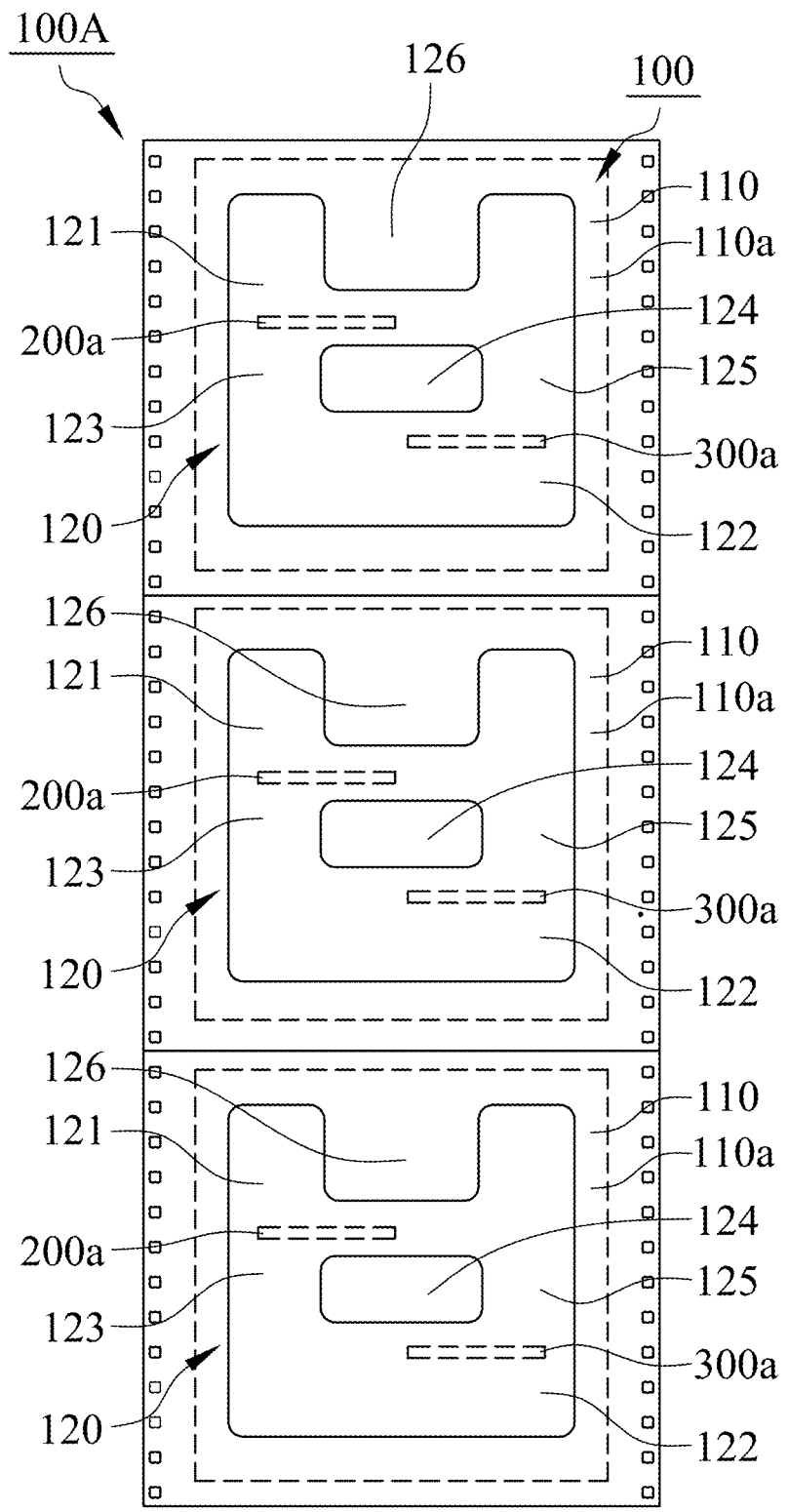
FIG. 3 is a bottom view diagram illustrating a circuit board tape in accordance with a first embodiment of the present invention.
Figure 4:
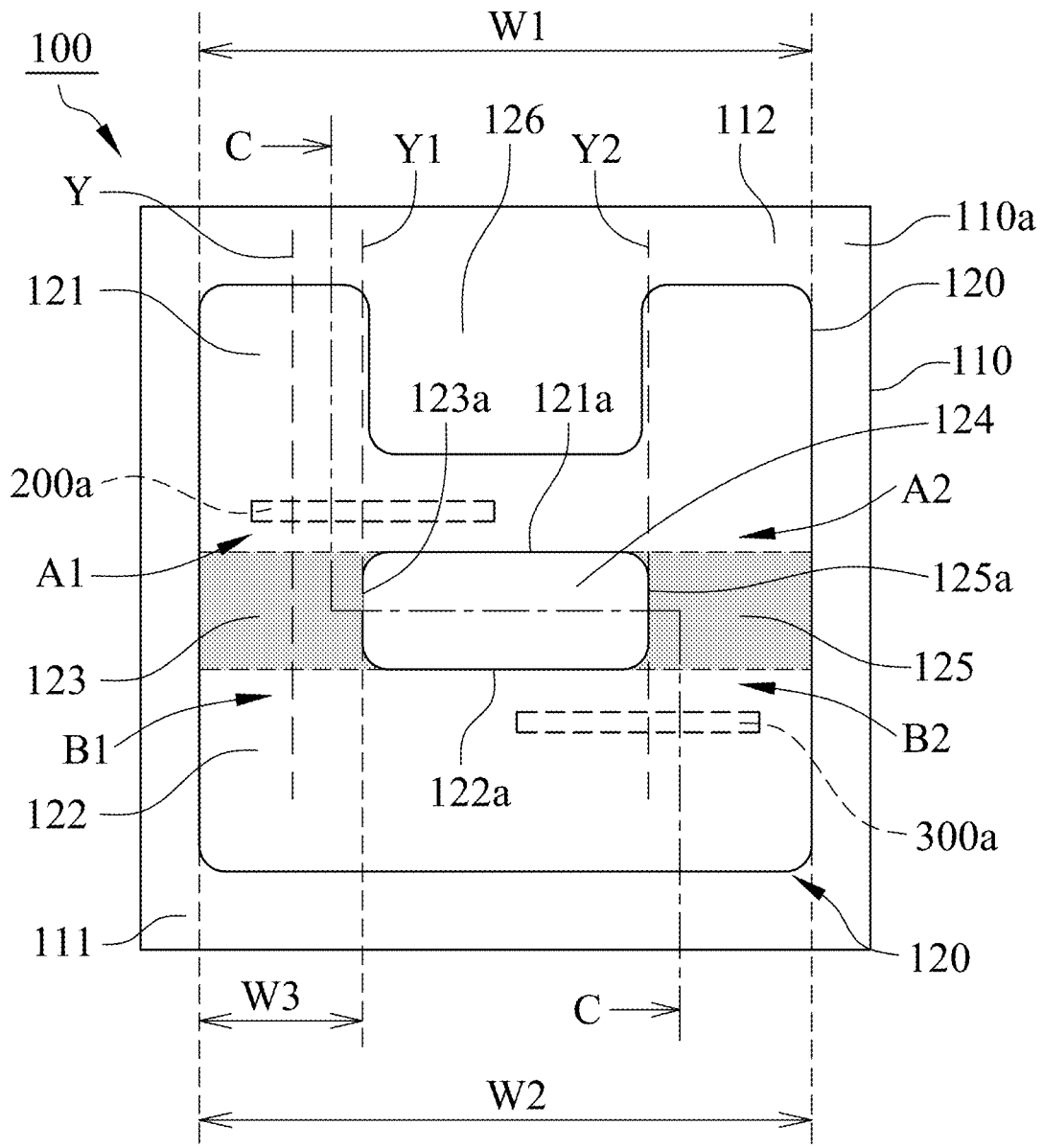
FIG. 4 is a bottom view diagram illustrating a thin film circuit board in accordance with the first embodiment of the present invention.
Figure 5:
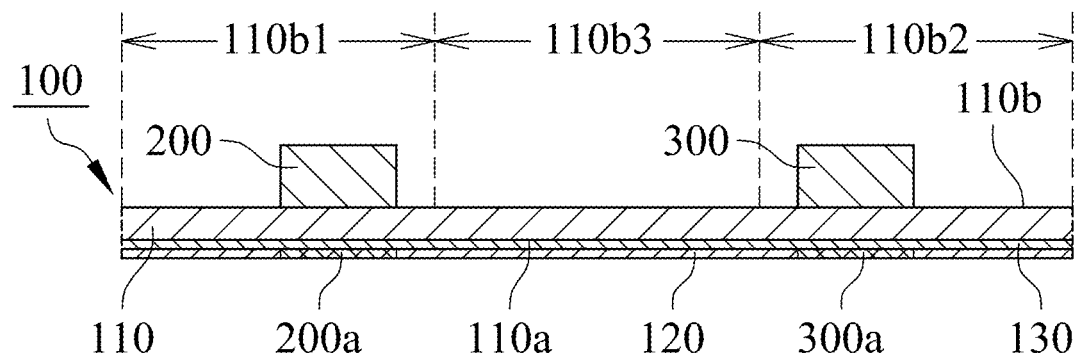
FIG. 5 is a cross-section view along C-C line of FIG. 4.

With reference to FIGS. 3 to 5, a circuit board tape 100A in accordance with a first embodiment of the present invention involves a plurality of thin film circuit boards 100. Each of the thin film circuit boards 100 includes a substrate 110 and a thermal conductive film 120 whose shape is polygonal and non-rectangular. The thermal conductive film 120 is adhered to a first surface 110a of the substrate 110 by an adhesive 130, and a first chip 200 and a second chip 300 can be mounted on each of the thin film circuit boards 100. The thin film circuit boards 100 are cut and separated from the circuit board tape 100A, and a chip-on-film (COF) package including the thin film circuit board 100, the first chip 200 and the second chip 300 can be obtained.

With reference to FIGS. 4 and 5, the first chip 200 and the second chip 300 are mounted on a second surface 110b of the substrate 110, and they are arranged on different areas of the second surface 110b with misalignment. In the first embodiment, a first area 110b1, a second area 110b2 and a third area 110b3 are defined on the second surface 110b of the substrate 110, the first chip 200 is located on the first area 110b1 and the second chip 300 is located on the second area 110b2 so that the third area 110b3 located between the first area 110b1 and the second area 110b2 is visible.

With reference to FIGS. 4 and 5, the thermal conductive film 120 of the first embodiment has a shape like an inverted capital A and it includes a first conductive portion 121, a second conductive portion 122 and a third conductive portion 123. The third conductive portion 123 is located between the first conductive portion 121 and the second conductive portion 122, and it is connected to the first conductive portion 121 and the second conductive portion 122. The first chip 200 and the second chip 300 are located over the first conductive portion 121 and the second conductive portion 122, respectively, thus a first chip shadow 200a and a second chip shadow 300a are projected on the first conductive portion 121 and the second conductive portion 122, respectively. The third area 110b3 defined on the second surface 110b is located over the third conductive portion 123.

With reference to FIGS. 3 and 4, the first conductive portion 121, the second conductive portion 122 and the third conductive portion 123 of the thermal conductive film 120 are arranged to be passed through by an imaginary line Y in a direction of transporting the circuit board tape 100A. Along a direction perpendicular to the imaginary line Y, the first conductive portion 121 has a first corner A1 and a first side 121a connected to the first corner A1, and the second conductive portion 122 has a second corner B1 and a second side 122a connected to the second corner B1.

With reference to FIGS. 3 and 4, the third conductive portion 123 is connected to the first corner A1 of the first conductive portion 121 and the second corner B1 of the second conductive portion 122 and exposes the first side 121a of the first conductive portion 121 and the second side 122a of the second conductive portion 122. In the first embodiment, a third width W3 of the third conductive portion 123 is less than a first width W1 of the first conductive portion 121 and a second width W2 of the second conductive portion 122 in the direction perpendicular to the imaginary line Y. Preferably, in order to improve warpage and bend resistance of the third conductive portion 123, the first chip 200 is arranged to allow the first chip shadow 200a to be passed through by a first imaginary line Y1 which extends outwardly from a third side 123a of the third conductive portion 123.

With reference to FIG. 4, a first notch 124 of the thermal conductive film 120 is located on one side of the third conductive portion 123. In the first embodiment, the first side 121a of the first conductive portion 121, the second side 122a of the second conductive portion 122 and the third side 123a of the third conductive portion 123 are also sides of the first notch 124. The first notch 124 exposes the first surface 110a of the substrate 110 and is provided to release stress generated due to different material properties of the substrate 110, the thermal conductive film 120 and the adhesive 130, such as different plasticity, ductility or thermal extension coefficient. Thus, the first notch 124 on the thermal conductive film 120 can avoid warpage of the circuit board tape 100A.

Referring to FIG. 4, the thermal conductive film 120 further includes a fourth conductive portion 125 in the first embodiment. The fourth conductive portion 125 is located between the first conductive portion 121 and the second conductive portion 122, and the third area 110b3 defined on the second surface 110b of the substrate 110 is located over the third conductive portion 123, the first notch 124 and the fourth conductive portion 125. The fourth conductive portion 125 is connected to a third corner A2 of the first conductive portion 121 and a fourth corner B2 of the second conductive portion 122 and exposes the first side 121a of the first conductive portion 121 and the second side 122a of the second conductive portion 122. The first notch 124 is located between the third conductive portion 123 and the fourth conductive portion 125 and it is a closed notch. Preferably, in order to improve warpage and bend resistance of the fourth conductive portion 125, the second chip 300 is arranged to allow the second chip shadow 300a to be passed through by a second imaginary line Y2 which extends outwardly from a fourth side 125a of the fourth conductive portion 125.

With reference to FIG. 4, there is further a second notch 126 on the first conductive portion 121 of the thermal conductive film 120 in the first embodiment. The second notch 126 exposes the first surface 110a of the substrate 110 and it is an open notch provided to release stress to protect the circuit board tape 100A from warpage. The first chip 200 is arranged to allow the first chip shadow 200a to be located between the first notch 124 and the second notch 126.

Figure 6:
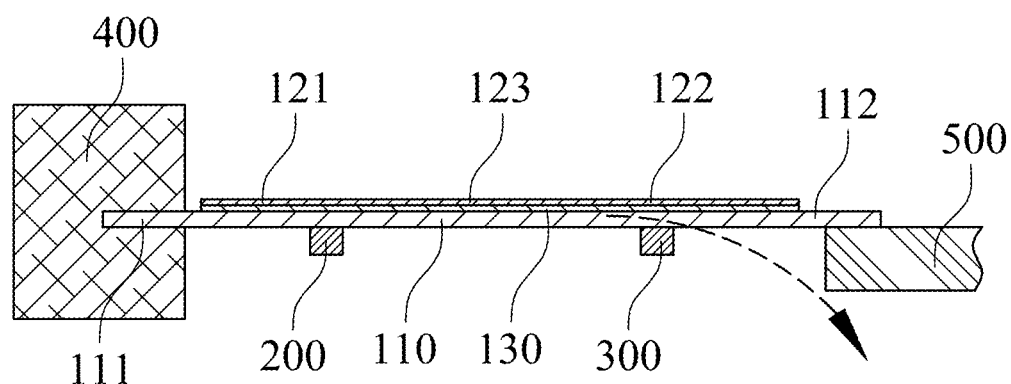
FIG. 6 is a cross-section view diagram illustrating the thin film circuit board hold on a fixture in accordance with the first embodiment of the present invention.

With reference to FIGS. 4 and 6, bend resistance of the substrate 110 can be improved due to the first conductive portion 121 and the second conductive portion 122 are connected with each other through the third conductive portion 123 and/or the fourth conductive portion 125 so as to prevent the thin film circuit board 100 from bending. When a first portion 111 of the thin film circuit board 100 is fixed on a fixture 400, a second portion 112 of the thin film circuit board 100 can be bonded to an electronic component 500 (e.g. display panel or another circuit board) precisely. Thus, the present invention can solve the problem that the conventional thin film circuit board is bent by gravity and cannot be connected to an electronic component precisely.

Figure 7:
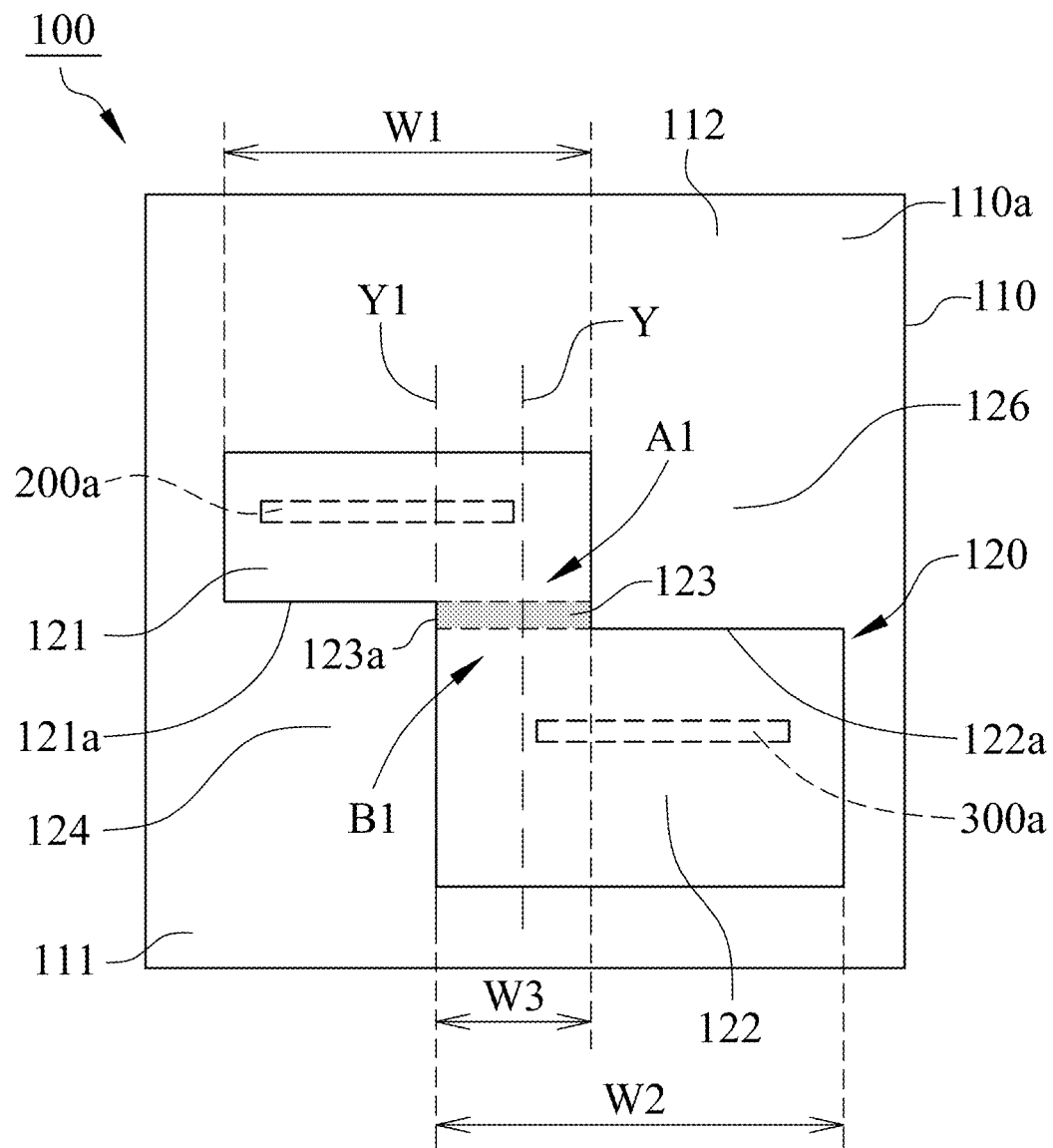
FIG. 7 is a bottom view diagram illustrating a thin film circuit board in accordance with a second embodiment of the present invention.

A second embodiment of the present invention is shown in FIG. 7. Different to the first embodiment, the third conductive portion 123 of the second embodiment is located between the first notch 124 and the second notch 126 in the direction perpendicular the imaginary line Y, and the first notch 124 and the second notch 126 are both open notches. In the second embodiment, the shape of the thermal conductive film 120 looks like a capital Z, the third conductive portion 123 is connected to the first corner A1 of the first conductive portion 121 and the second corner B1 of the second conductive portion 122 and exposes the first side 121a of the first conductive portion 121 and the second side 122a of the second conductive portion 122. The first side 121a is also one side of the first notch 124, and the second side 122a is also one side of the second notch 126. Identical to the first embodiment, the first conductive portion 121 and the second conductive portion 122 are wider than the third conductive portion 123 in width.

Figure 8:
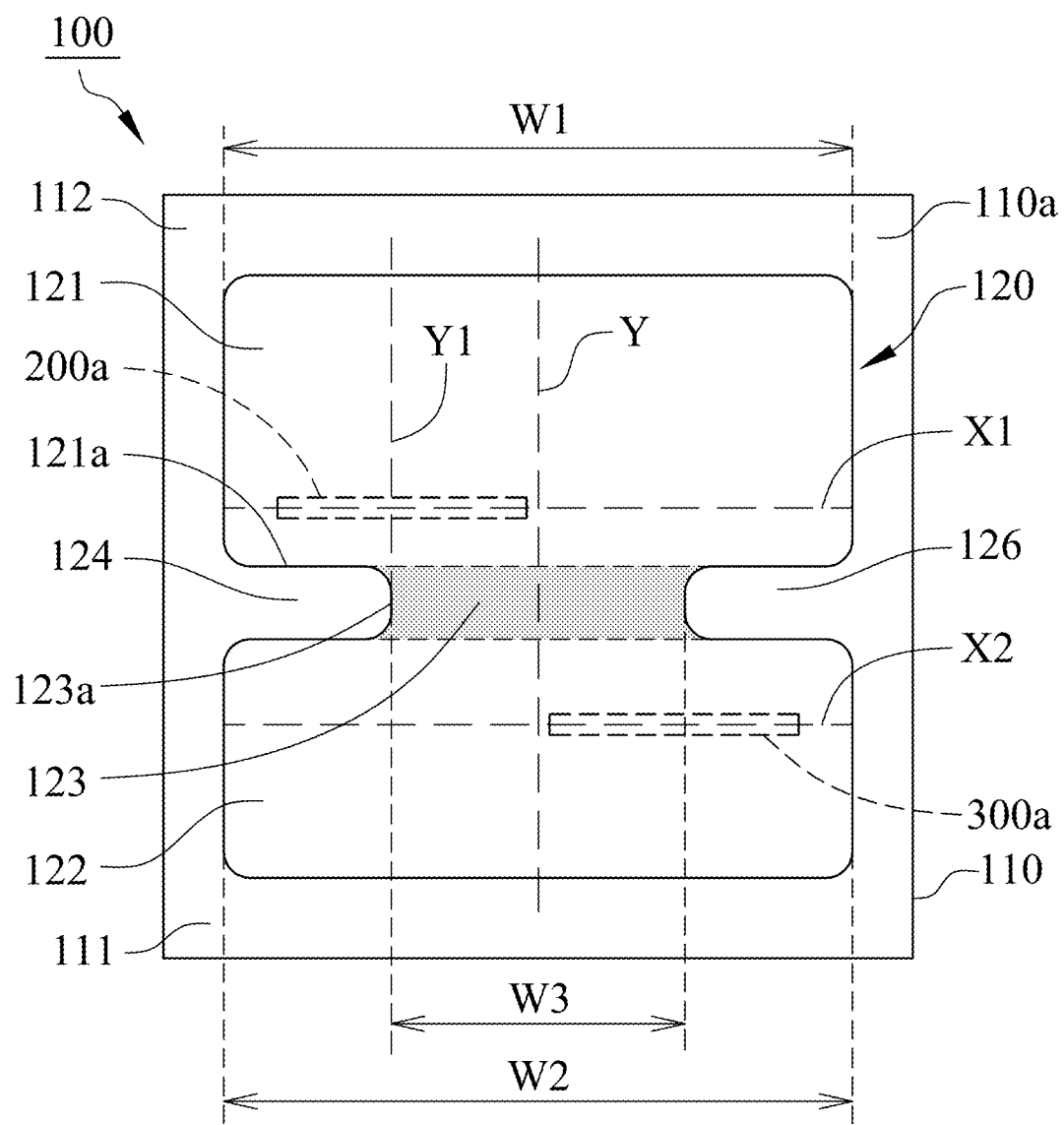
FIG. 8 is a bottom view diagram illustrating a thin film circuit board in accordance with a third embodiment of the present invention.

As shown in FIG. 8, the thermal conductive film 120 of a third embodiment of the present invention has a shape like a capital H turned by 90 degrees or a capital I. Along the direction perpendicular to the imaginary line Y, the third conductive portion 123 is located between the first notch 124 and the second notch 126 which ae both open notches. The first chip shadow 200 is passed through by a third imaginary line X1 which is perpendicular to the imaginary line Y, the second chip shadow 300a is passed through by a fourth imaginary line X2 which is perpendicular to the imaginary line Y, and the third conductive portion 123 is located between the third imaginary line X1 and the fourth imaginary line X2. In the third embodiment, the first conductive portion 121 and the second conductive portion 122 are also wider than the third conductive portion 123 in width.

Figure 9:
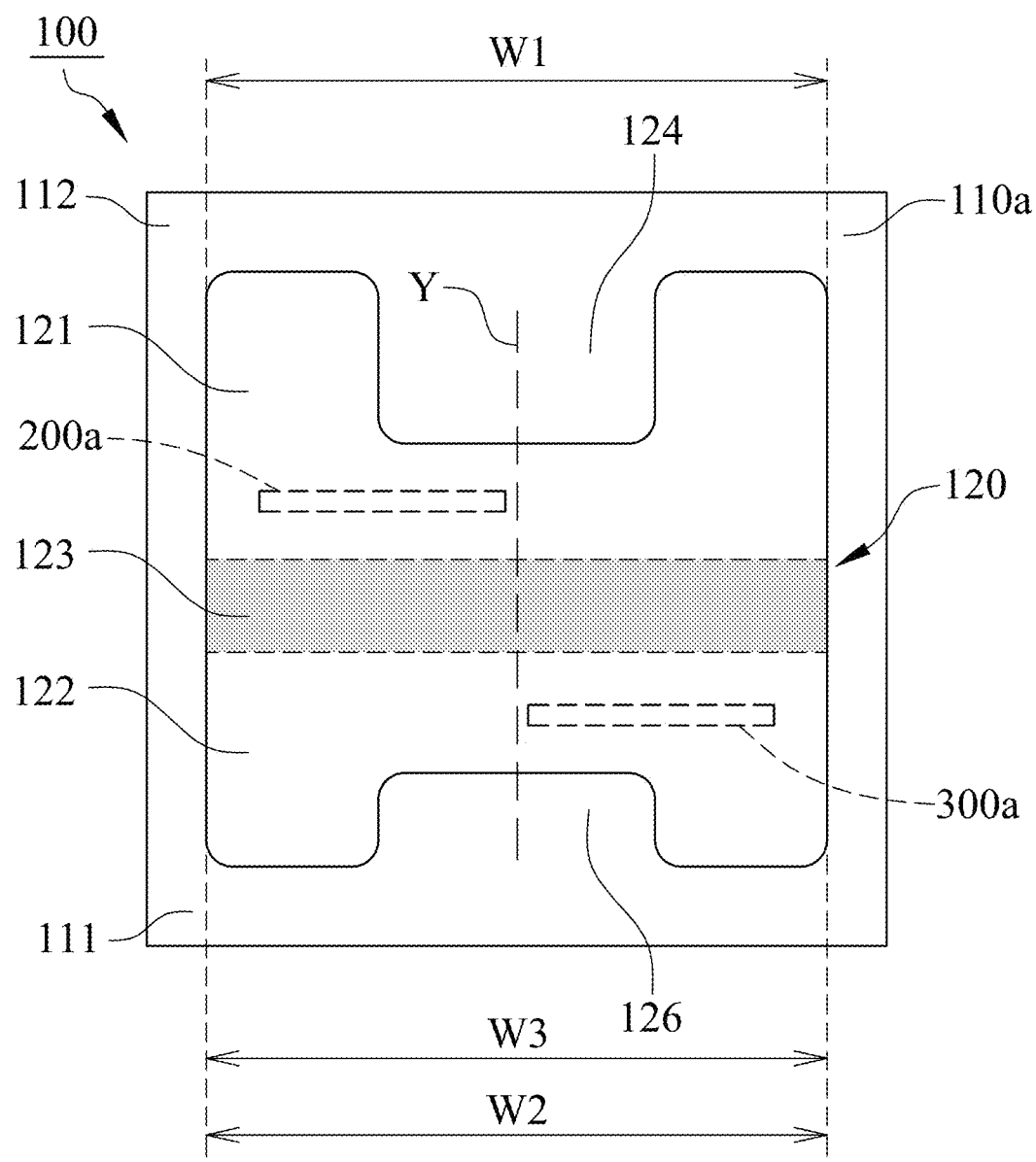
FIG. 9 is a bottom view diagram illustrating a thin film circuit board in accordance with a fourth embodiment of the present invention.

With reference to FIG. 9, in a fourth embodiment of the present invention, the shape of the thermal conductive film 120 looks like a capital H, and the third width W3 of the third conductive portion 123 is greater than or equal to the first width W1 of the first conductive portion 121 and the second width W2 of the second conductive portion 122. The first notch 124 and the second notch 126 of the fourth embodiment are located on the first conductive portion 121 and the second conductive portion 122, respectively, and they expose the substrate 110. Along the direction perpendicular to the imaginary line Y, the first chip shadow 200a is located between the first notch 124 and the third conductive portion 123, the second chip shadow 300a is located between the second notch 126 and the third conductive portion 123, and the first chip shadow 200a and the second chip shadow 300a are located between the first notch 124 and the second notch 126.

In the present invention, the thermal conductive film 120 is designed to be polygonal and non-rectangular, the first notch 124 and/or the second notch 126 are provided to reduce or release stress caused by different material properties, and the first conductive portion 121 is connected to the second conductive portion 122 through the third conductive portion 123 and/or the fourth conductive portion 125. Consequently, area and thermal performance of the thermal conductive film 120 can be increased, and bend resistance of the substrate 110 can be improved to avoid warpage or bending in the thin film circuit board 100.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A thin film circuit board comprising:
   a substrate including a first surface and a second surface, the second surface is configured for placement of a first chip and a second chip; and
   a polygonal and non-rectangular thermal conductive film adhered to the first surface of the substrate and including a first conductive portion, a second conductive portion and a third conductive portion, the third conductive portion is located between and connected to the first and second conductive portions, wherein the first and second chips are configured to be arranged over the thermal conductive film to form a first chip shadow and a second chip shadow, respectively.

2. The thin film circuit board in accordance with claim 1, wherein a first area, a second area and a third area are defined on the second surface of the substrate, the first and second chips are configured to be mounted on the first and second areas, respectively, with misalignment and expose the third area located between the first and second areas, the first chip is configured to be arranged over the first conductive portion such that the first chip shadow is projected on the first conductive portion, the second chip is configured to be arranged over the second conductive portion such that the second chip shadow is projected on the second conductive portion, and the third area is located over the third conductive portion.

3. The thin film circuit board in accordance with claim 2, wherein the first conductive portion, the second conductive portion and the third conductive portion are arranged to be passed through by an imaginary line, and a third width of the third conductive portion is less than a first width of the first conductive portion and a second width of the second conductive portion in a direction perpendicular to the imaginary line.

4. The thin film circuit board in accordance with claim 3, wherein there is a first notch on the thermal conductive film, the first notch is located on one side of the third conductive portion, and the substrate is exposed by the first notch.

5. The thin film circuit board in accordance with claim 4, wherein there is further a second notch on the thermal conductive film, the third conductive portion is located between the first and second notches, and the substrate is exposed by the second notch.

6. The thin film circuit board in accordance with claim 5, wherein the third conductive portion is located between the first and second notches in the direction perpendicular to the imaginary line and is located between a third imaginary line and a fourth imaginary line which are perpendicular to the imaginary line, the third imaginary line passes through the first chip shadow, and the fourth imaginary line passes through the second chip shadow.

7. The thin film circuit board in accordance with claim 4, wherein the first conductive portion includes a first corner and a first side connected to the first corner, the second conductive portion includes a second corner and a second side connected to the second corner, the third conductive portion is connected to the first and second corners and exposes the first and second sides.

8. The thin film circuit board in accordance with claim 7, wherein the thermal conductive film further includes a fourth conductive portion which is located between the first and second conductive portions, the fourth conductive portion is connected to a third corner of the first conductive portion and a fourth corner of the second conductive portion and exposes the first and second sides, and the first notch is located between the third and fourth conductive portions.

9. The thin film circuit board in accordance with claim 8, wherein the first notch is a closed notch.

10. The thin film circuit board in accordance with claim 9, wherein there is a second notch on the first conductive portion of the thermal conductive film, the substrate is exposed by the second notch, and the first chip shadow is located between the first and second notches.

11. The thin film circuit board in accordance with claim 8, wherein the first chip shadow is passed through by a first imaginary line which extends outwardly from a third side of the third conductive portion.

12. The thin film circuit board in accordance with claim 8, wherein the second chip shadow is passed through by a second imaginary line which extends outwardly from a fourth side of the fourth conductive portion.

13. The thin film circuit board in accordance with claim 2, wherein the first conductive portion, the second conductive portion and the third conductive portion are arranged to be passed through by an imaginary line, a third width of the third conductive portion is equal to a first width of the first conductive portion and a second width of the second conductive portion in a direction perpendicular to the imaginary line, there is a first notch on the first conductive portion of the thermal conductive film, the substrate is exposed by the first notch, and the first chip shadow is located between the first notch and the third conductive portion.

14. The thin film circuit board in accordance with claim 13, wherein there is a second notch on the second conductive portion of the thermal conductive film, the substrate is exposed by the second notch, and the second chip shadow is located between the second notch and the third conductive portion.

15. The thin film circuit board in accordance with claim 14, wherein the first and second chip shadows are located between the first and second notches.

16. The thin film circuit board in accordance with claim 1, wherein the first chip shadow is passed through by a first imaginary line which extends outwardly from a third side of the third conductive portion.

\* \* \* \* \*